United States Patent [19]
Baker

[11] 4,101,788
[45] Jul. 18, 1978

[54] MOS BUFFER CIRCUIT
[75] Inventor: Lamar T. Baker, Manhattan Beach, Calif.
[73] Assignee: Xerox Corporation, Stamford, Conn.
[21] Appl. No.: 779,122
[22] Filed: Mar. 18, 1977
[51] Int. Cl.² .............. H03K 19/08; H03K 19/34; H03K 19/36; H03K 19/40
[52] U.S. Cl. .............................. 307/205; 307/214; 307/215; 307/237; 307/270; 307/DIG. 1
[58] Field of Search ............... 307/205, 208, 214, 215, 307/237, 264, 270, DIG. 1, 251; 328/169–172

[56] References Cited
U.S. PATENT DOCUMENTS

| | | | |
|---|---|---|---|
| Re. 27,305 | 3/1972 | Polkinghorn et al. | 307/251 |
| 3,675,043 | 7/1972 | Bell | 307/DIG. 1 |
| 3,775,693 | 11/1973 | Proebsting | 307/205 X |
| 3,986,044 | 10/1976 | Madland et al. | 307/205 |

OTHER PUBLICATIONS

Homan, "FET Depletion Load Push-Pull Logical Circuit"; *IBM Tech. Discl. Bull.*, vol. 18, No. 3, pp. 910–911; Aug. 1975.
Hayashi et al., "Design of ED-MOS Buffer"; *Electronics and Communications in Japan* (pub.), vol. 55-c, No. 10; pp. 107–114; Oct. 1972.

*Primary Examiner*—Larry N. Anagnos
*Attorney, Agent, or Firm*—James J. Ralabate; Sheldon F. Raizes; Ronald L. Taylor

[57] ABSTRACT

A MOS control circuit for controlling an output signal, said control circuit being coupled to first and second sources of potential. The magnitude or peak-to-peak amplitude of the first source of potential is greater than the magnitude developed by the second source of potential. The control circuit output signal has a waveshape magnitude of desired dimension somewhere between the magnitude of the second source of potential and the magnitude of the first source of potential. In order to accomplish this, a first inverter receives and inverts an input signal and produces an output potential at a node. A clamping circuit reduces the potential at the node by a desired amount. A source follower is driven by the potential at the node and also receives the input signal. The output of the source follower is the control output signal.

19 Claims, 7 Drawing Figures

MOS BUFFER CIRCUIT

BACKGROUND OF THE INVENTION

A. Field of the Invention

This invention relates to MOS buffer circuits in general and to a MOS level shifter/driver circuit in particular.

B. Description of the Prior Art

In MOS circuitry there is often a need for controlling one signal with another, such as controlling the output of a circuit with an input signal or for buffering a signal. In such circuits it is often desirable or necessary to have the output voltage greater than the input signal voltage but less than the source of potential used to power the circuit.

For example, on a MOS chip containing thousands of elements the transformation and manipulation of digital data is orchestrated by timing signals generated by a clock. Therefore, all logic transitions must take place within a critical time interval as determined by the clock period. Since a MOS device is essentially a capacitive load, the speed with which the device may be charged or discharged becomes critical. Therefore, it is often necessary to provide a signal having a particular magnitude to ensure a desired switching speed. In this case, the magnitude of this signal is greater than another available signal but less than the magnitude of the source of potential employed to power the circuit or circuits on a chip.

One of the well-known prior art techniques for generating a voltage in a MOS circuit which is greater than the potential applied to the circuit is bootstrapping. In order to accomplish bootstrapping, a bootstrapping circuit is employed. The bootstrapping circuit contains a capacitive load which must be charged. Further, the use of a bootstrap circuit requires a sequence of timing signals.

As will be seen, the present circuit eliminates the need for bootstrapping and the attendant use of timing signals.

SUMMARY OF THE INVENTION

A MOS control circuit utilized for producing an output control signal which is the complement of an input signal and which has a magnitude greater than the magnitude of the input signal but less than the magnitude of the source of potential used to power the control circuit is disclosed. In the subject invention, first and second sources of potential are employed to power the control circuit. The first source of potential has a magnitude (peak-to-peak amplitude) greater than that of the second source of potential. A first inverter is used to invert an input signal. The magnitude of the input signal may be of any desired value as explained hereinafter. The inverter then produces an output potential at a node. The node potential has a magnitude equal to the magnitude of the first source of potential. Second circuit means coupled to the second source of potential is used to reduce the node potential by a desired amount. A source follower is coupled to the first source of potential and is driven by the reduced node potential to an output signal. The output of the source follower is also the output of the control circuit. The output control signal has a magnitude greater than the magnitude of the second source of potential but less than the magnitude of the first source of potential.

It is an object of the present invention to provide a MOS control circuit having an output which is the complement of an input signal, said output having a magnitude greater than the magnitude of the input signal and second source of potential.

It is a further object to provide an MOS control circuit having an output which is the complement of an input signal, the output having a magnitude greater than the input signal but less than the magnitude of the source of potential used to power the circuit.

It is yet another object to provide an MOS control circuit capable of performing logic operations on a plurality of input signals, wherein an output signal is produced which has a magnitude greater than the magnitude of any one of the input signals.

It is still a further object to provide an MOS control circuit capable of performing logic operations on at least one input signal, wherein an output signal is produced which has a magnitude that is related to the magnitudes of the sources of potential used to power the control circuit.

Other objects and advantages of this invention will further become apparent hereinafter and in the drawings in which:

Figure 1:
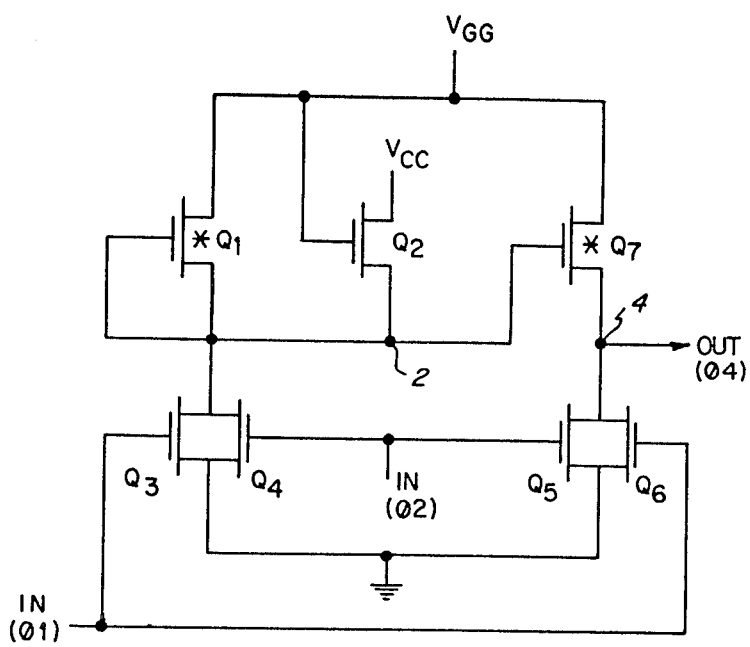
FIG. 1 is a preferred embodiment of the MOS control circuit.

In describing the preferred embodiment of the invention illustrated in the drawings, specific terminology will be resorted to for the sake of clarity. However, it is not intended to be limited to the specific terms so selected, and it is to be understood that each specific term includes all technical equivalents which operate in a similar manner to accomplish a similar purpose.

DETAILED DESCRIPTION OF THE PREFERRED EMBODIMENT

In a presently preferred embodiment, the MOS control circuit is fabricated on a P-type silicon substrate and employs N-channel devices. The circuit employs depletion devices which are fabricated by ion implantation. All of the transistors in the circuits employ polycrystalline silicon gates.

It is to be understood that the subject invention may be practiced using other MOS technologies. For example, the circuit may be fabricated on an N-type silicon substrate and employ P-channel devices. Further, the depletion devices may be fabricated by metal gate implantation. The circuit may be made operative by using negative logic.

A preferred embodiment of the MOS control circuit employing depletion load devices is disclosed in FIG. 1. A depletion field effect device Q1 has one of its regions connected to a first source of potential Vgg. In the preferred embodiment, the first source of potential is 12 volts. The other region of device Q1 is connected to node 2. The gate of Q1 is likewise connected to node 2. An enhancement field effect device Q2 has one of its regions connected to a second source of potential Vcc, which in the preferred embodiment is typically 5 volts.

The other region of device Q2 is connected to node 2. The gate of Q2 is connected to the first source of potential Vgg. An enhancement field effect device Q3 has one of its regions connected to node 2 and its other region connected to ground. It should be pointed out at this point that the term ground as used in this application need not be zero volts. The gate of device Q3 receives an input signal φ1. An enhancement field effect device Q4 has one of its regions connected to node 2 and its other region connected to ground. The gate of device Q4 receives an input signal φ2. An enhancement field effect device Q5 has one of its regions connected to an output port 4 and its other region connected to ground. The gate of device Q5 receives the φ2 input signal. An enhancement field effect device Q6 has one of its regions connected to output port 4 and its other region connected to ground. The gate of device of Q6 receives the φ1 input signal. A depletion field effect device Q7 has one of its regions connected to the first source of potential Vgg and its other region connected to the output port 4. The gate of device Q7 is connected to node 2.

Figure 3:
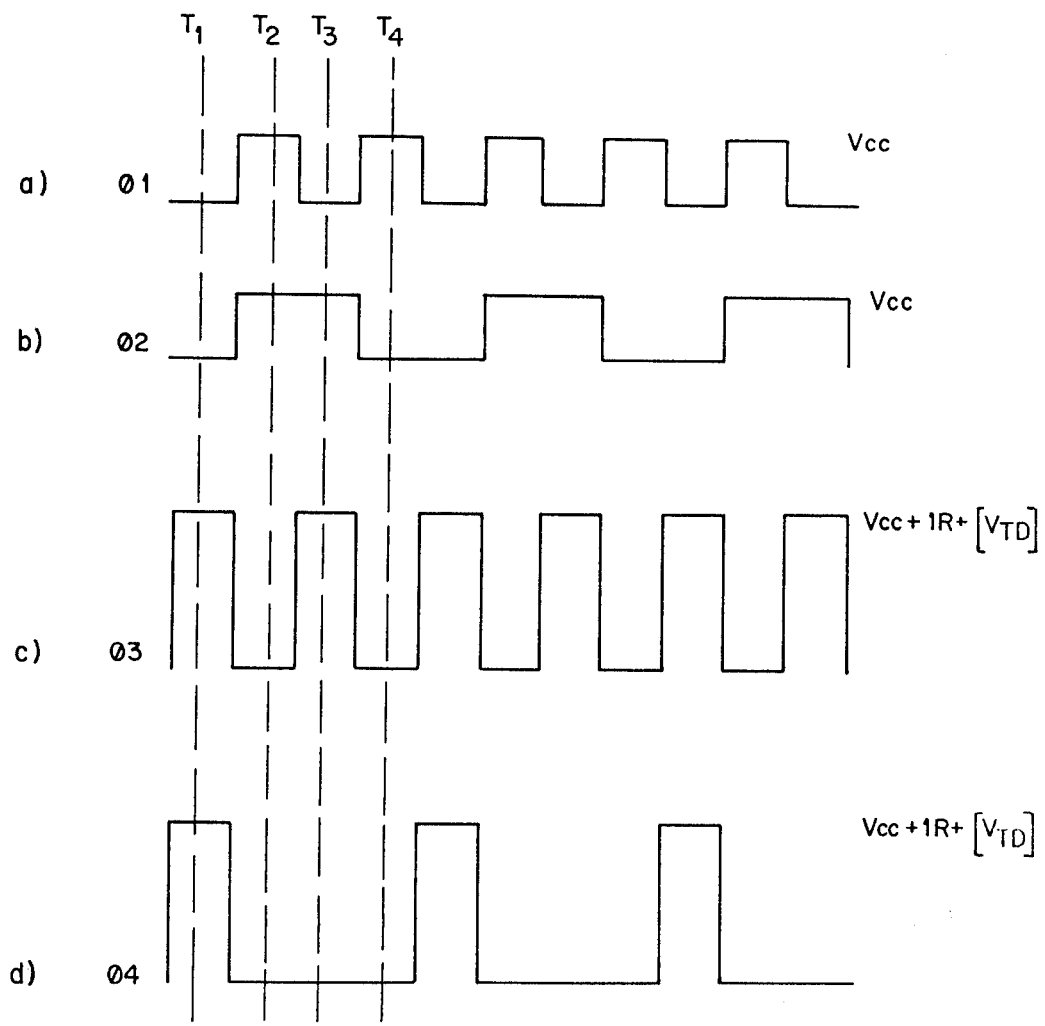
FIGS. 3a–3d are waveforms which aid in describing the operation of the preferred embodiments.

In order to describe the operation of the circuit depicted in FIG. 1, it is necessary to make reference to the waveforms shown in FIG. 3. FIG. 3a shows the φ1 input signal. FIG. 3b shows the φ2 input signal. FIG. 3d shows the control circuit output signal 14 which appears at output port 4.

At time T1, both the φ1 input signal and the φ2 input signal are at logic zero. Thus, devices Q3–Q6 are not conducting because the voltage level of the logic zero is below the threshold voltage for these enhancement field effect devices. Device Q1 is operating as a current generator to transfer charge to node 2 and to drive device Q7. Since the voltage of Vgg is greater than the threshold voltage of device Q2, the device is conducting. Initially, when there is no charge at node 2, device Q2 is transferring charge to node 2 to raise node 2 to the Vcc potential. However, when the potential at node 2 exceeds Vcc, the direction of current flow in device Q2 is reversed and device Q2 transfers charge away from node 2. It should be pointed out that because device Q2 has its gate connected to the first source of potential, device Q2 is always conducting and transferring charge be it to or away from node 2.

Device Q7 is a depletion device and, as such, conducts with zero gate voltage. Therefore, even with zero gate voltage, device Q7 will tend to transfer charge and raise the potential at the output port 4 to the absolute value of the threshold voltage for the device Q7. Device Q2 operates as a resistance divider, impedance divider, or clamp to reduce the potential at node 2 by a desired amount. Thus, the potential at node 2 is equal to the potential of the second potential source Vcc plus the voltage drop (IR) across device Q2. The potential at node 2 is used to drive the gate of depletion device Q7.

This causes an increase in the charge transfer to output port 4 such that the magnitude of the output signal is equal to Vcc plus IR plus the absolute value of the threshold voltage of the depletion device Q7. Devices Q5–Q7 thus act as a source follower. In the preferred embodiment, the φ1 input and the φ2 input each have a magnitude of 5 volts and the control circuit output has been adjusted to be approximately 9 volts. It should be pointed out that the input signals may be of any desired magnitude. The primary requirement is that when an input signal is at logic 1 the magnitude must be greater than the threshold voltage of the device driven by the signal.

At time T2, both the φ1 and φ2 input signals are at logic 1. The voltage level of the logic 1 signal is high enough to cause devices Q3–Q6 to conduct. These devices then act as pull-down devices to draw off any charge at nodes 2 and output port 4 to ground, thus reducing the output signal to a logic zero.

At time T3, the φ1 input signal is at logic zero while the φ2 input signal is at logic 1. Thus devices Q3 and Q6 are not conducting while devices Q4 and Q5 are conducting. Devices Q4 and Q5 act as pull-down transistors to conduct any charge at node 2 and output port 4 to ground. Thus the output control signal is at logic zero.

At time T4, the φ1 input signal is at logic 1 and the φ2 input signal is at logic zero. Thus devices Q3 and Q6 now act as pull-down devices to transfer charge to ground and thus provide a control output signal of logic zero.

Thus the control circuit operation has been described for all input conditions. It can be seen that what has taken place is that the control circuit has performed a NOR function on two input signals and has produced an output signal representing the NOR function and having a magnitude greater than the magnitude of the second source of potential but less than the first source of potential. In addition, the magnitude of the output signal is greater than the magnitude of any one of the input signals.

Because the magnitude range of the control output signal is dependent on the magnitudes of the sources of potential Vgg and Vcc, and independent of the magnitudes of the input signals, it is possible, if desired, to produce a control output signal having a magnitude less than the magnitude of any one of the input signals.

It is to be understood that in the preferred embodiment devices Q3–Q6 are arranged so that the control circuit performs a NOR function. Devices Q3–Q6 could, however, be arranged in series and in that way have the control circuit perform a NAND function. Other arrangements will be obvious to those skilled in the art.

Figure 4:
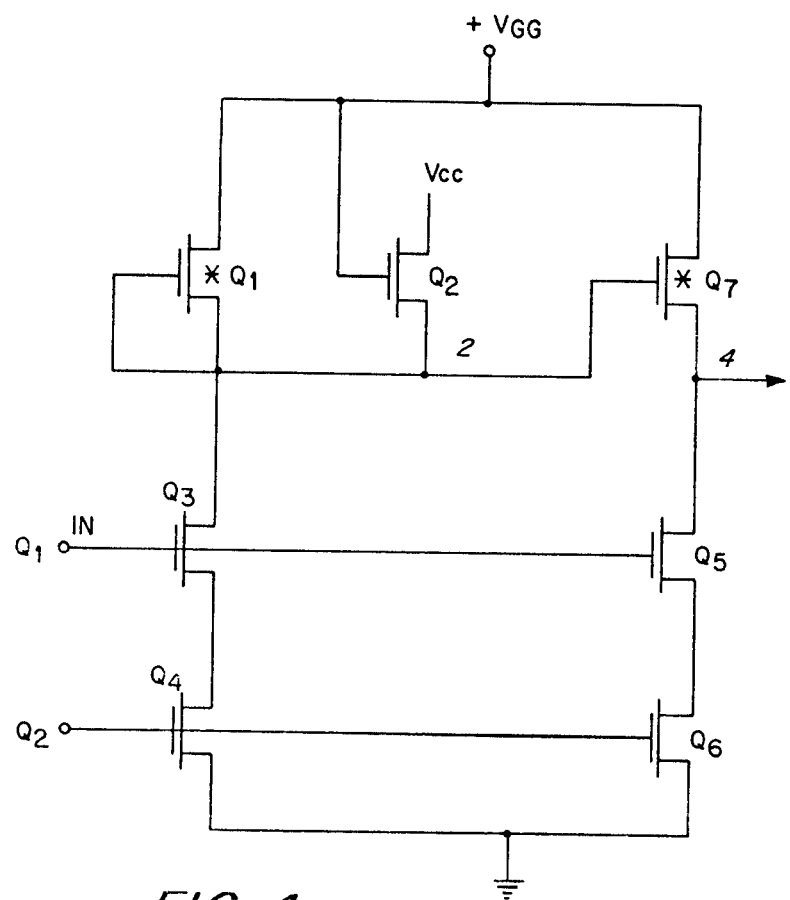
FIG. 4 is another embodiment of the MOS Control Circuit and particularly a modification of the NOR Circuit of FIG. 1 into a NAND Circuit.

The rearrangement of devices Q3 through Q6 of FIG. 1 to convert that NOR Circuit to a NAND Circuit is shown in FIG. 4.

In FIG. 4, all similar part have similar numbers in conformance with FIG. 1.

As shown in FIG. 4, Q3 and Q4 are connected in series so that input signals φ1 and φ2 must both be present at the gates of Q3 and Q4 as well as the gates of Q5 and Q6 to enable those MOS devices and reduce the charge at both node 2 and output port 4 to a lower potential.

The NOR gate of FIG. 1 and the NAND gate of FIG. 4 can be converted to an AND and an OR gate respectively by providing an inverter at output port 4.

Figure 2:
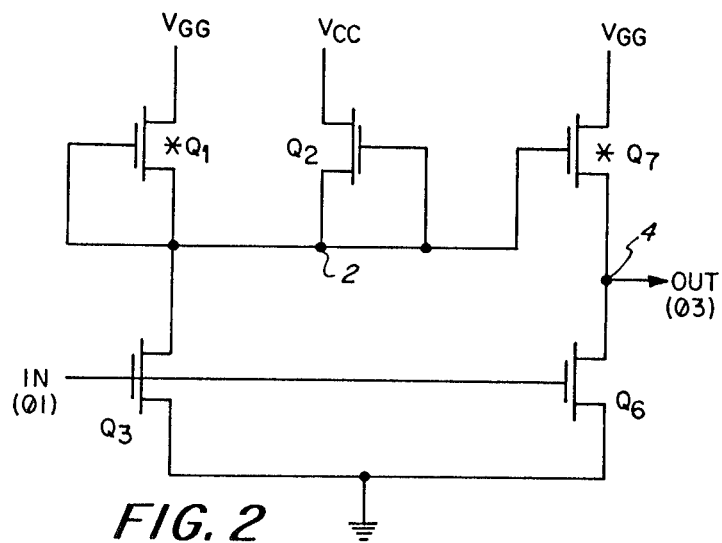
FIG. 2 is another embodiment of the MOS control circuit.

Another embodiment for the control circuit is disclosed in FIG. 2. Like reference numerals represent like elements to those disclosed in FIG. 1. Depletion field effect devices Q1 and Q7 and enhancement field effect devices Q3 and Q6 are connected to the first source of potential Vgg, node 2, and output port 4 in the same manner as like devices are connected in the FIG. 1 embodiment. In the FIG. 2 embodiment, enhancement field effect device Q2 has one of its regions connected to the second source of potential Vcc and its other region connected to node 2. The gate of device Q2 is, however, connected to node 2. The gates of devices Q3 and Q6 receive the input signal φ1.

In describing the operation of the circuit depicted in FIG. 2, reference will be made to the waveform shown in FIG. 3. FIG. 3a shows the φ1 input signal. FIG. 3c shows the control circuit output signal 03 developed at the output port 4.

At time T1, the φ1 input is at a logic zero and devices Q3 and Q5 do not conduct. Device Q1 acts as a current generator and transfers charge to the gate of devices Q2 and Q7. Because the potential at node 2 is greater than Vcc, device Q2 conducts current in a direction which transfers charge away from node 2. The capacitive loads representing device Q2 and Q7 are charged until a steady state condition is reached, at which time any further charge transfer takes place through conducting device Q2. Device Q2 has the effect of lowering the potential at node 2. This lower node potential appears at the gate of Q7.

Depletion field effect device Q7 conducts even when the gate voltage is zero. When device Q7 is conducting with zero gate voltage, the potential at output port 4 tends to be equal to the absolute value of the threshold voltage of the depletion device. By raising the gate voltage of device Q7 to the node potential the output at the output port 4 is increased by a value equal to Vcc plus the voltage drop (IR) across device Q2. The control circuit output at the output port 4 is equal to Vcc plus the voltage drop across the device Q2 plus the absolute value of the threshold voltage of device Q7. Devices Q6 and Q7 thus act as a soruce follower.

At time T2, the φ1 input is at logic 1, thus causing devices Q3 and Q5 to conduct. Devices Q3 and Q5 act as pull-down devices to transfer the charge at node 2 and output port 4 to ground. In this way, the control circuit output at output port 4 is a logic zero. Thus the operation of the control circuit for all input conditions has been described. It can be seen that the control circuit provides a complementary output for an input signal, wherein the magnitude of the output signal is greater than the magnitude of the input signal but less than the magnitude of the first voltage source.

Those skilled in the art will appreciate that the gate connection arrangement for device Q2 in FIGS. 1 and 2 are interchangeable. In addition, a plurality of inputs may be added to the control circuit in FIG. 2 to perform the logic function as was previously discussed with respect to the control circuit shown in FIG. 1.

In the preferred embodiments, the sizes of the MOS field effect devices are as follows: Q1 is 24 microns × 8 microns, Q2 is 9 microns × 12 microns, Q3 is 144 microns × 6 microns, Q4 is 72 microns × 6 microns, Q5 is 300 microns × 6 microns, Q6 is 600 microns × 6 microns, and Q7 is 100 microns × 8 microns.

In the preferred embodiments, the width-to-length ratio (WL) of device Q7 is chosen to ensure a desired rise time for the control output signal. The width-to-length of devices Q3–Q6 are chosen to ensure a desired fall time for the control output signal. The width-to-length of device Q7 when compared to the width-to-length of device Q2 is typically approximately 4 to 1. The width-to-lengths of the pull-down devices when compared to the width-to-length of their associated pull-up device can be anywhere from approximately 1 to 1 to approximately 10 to 1 depending upon MOS process parameter values.

The magnitude of the control output signal can be altered by varying the width-to-length ratio of device Q2. The impedance of this device is inversely proportional to its channel width and directly proportional to its channel length. Thus the voltage drop across device Q2 may be made larger or smaller thereby increasing or decreasing the magnitude of the control output signal.

Obviously, many modifications and variations of the present invention are possible in light of the above teachings. It is therefore to be understood that within the scope of the appended claims, the invention may be practiced otherwise than as specifically described.

What is claimed is:

1. An MOS control circuit for controlling an output signal, said control circuit being coupled to first and second sources of potential comprising:
   (a) a node;
   (b) first circuit means for inverting an input signal and for producing an output potential at said node having a magnitude equal to the magnitude of said first source of potential;
   (c) second circuit means coupled to said second source of potential for reducing said node potential by a desired amount;
   (d) third circuit means coupled to said first cource of potential and driven by said reduced node potential for producing said control circuit output signal having a magnitude greater than the magnitude of said second source of potential but less than the magnitude of said first source of potential.

2. The circuit of claim 1 wherein each of said first and third circuit means further comprises logic means for performing a logic operation on a plurality of input signals.

3. The circuit of claim 2 wherein said logic operation is an "or" function.

4. The circuit of claim 2 wherein said logic operation is an "and" function.

5. The circuit of claim 2 wherein the magnitude of said second source of potential is less than the magnitude of said first source of potential.

6. The circuit of claim 5 wherein the magnitude of each one of said input signals is equal to the magnitude of said second source of potential.

7. An MOS control circuit for controlling an output signal, said control circuit being coupled to first and second sources of potential comprising:
   (a) a node;
   (b) first circuit means for inverting an input signal, and for producing an output potential at said node having a magnitude equal to the magnitude of said first source of potential;
   (c) a first MOS device coupled to said second source of potential and said node, said MOS device including a gate for receiving said first potential, this causing said first MOS device to conduct and reduce said node potential by a desired amount;
   (d) second circuit means coupled to said first source of potential and driven by said reduced node potential for producing said control circuit output signal having a magnitude greater than the magnitude of said second source of potential but less than the magnitude of said first source of potential.

8. The circuit of claim 7 wherein said first circuit means comprises:
   (a) a second MOS device coupled to said first source of potential and said node, said second MOS device including a gate coupled to said node; and (b) a third MOS device coupled to said node and a ground connection, said third MOS device including a gate for receiving said input signal.

9. The circuit of claim 8 wherein said second circuit means comprises:
   (a) a fourth MOS device coupled to said first source of potential and said control circuit output, said fourth MOS device including a gate coupled to said node; and
   (b) a fifth MOS device coupled to said control circuit output and said ground connection, said fifth MOS device including a gate for receiving said input signal.

10. The circuit of claim 9 wherein said first circuit means further comprises:
    a sixth MOS device coupled to said node and said ground connection, said sixth MOS device including a gate for receiving a second input signal.

11. The circuit of claim 9 wherein said first circuit means further comprises:
    a sixth MOS device coupled in series with said third MOS device between said node and said ground connection, said sixth MOS device including a gate for receiving a second input signal.

12. The circuit of claim 9 wherein said second circuit means further comprises:
    a sixth MOS device coupled to said control circuit output and said ground connection, said sixth MOS device including a gate for receiving a second input signal.

13. The circuit of claim 9 wherein said second circuit means further comprises:
    a sixth MOS device coupled in series with said fifth MOS device between said control circuit output and said ground connection, said sixth MOS device including a gate for receiving a second input signal.

14. The circuit of claim 9 wherein said second and fourth MOS devices are depletion field effect devices.

15. The circuit of claim 14 wherein said first, third and fifth MOS devices are enhancement field effect devices.

16. The circuit of claim 9 wherein said control circuit employs N-channel field effect transistors.

17. The circuit of claim 16 wherein said field effect transistors employ polycrystalline silicon gates.

18. The circuit of claim 7 wherein the gate of said first MOS device is coupled to said node.

19. The circuit of claim 7 wherein the gate of said first MOS device is coupled to said first source of potential.

* * * * *